United States Patent
Lin et al.

(10) Patent No.: US 8,645,807 B2
(45) Date of Patent: Feb. 4, 2014

(54) APPARATUS AND METHOD OF PROCESSING POLYNOMIALS

(75) Inventors: Yi-Min Lin, Taipei (TW); Chi-Heng Yang, Taipei County (TW); Hsie-Chia Chang, HsinChu (TW); Chen-Yi Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 607 days.

(21) Appl. No.: 12/790,875

(22) Filed: May 31, 2010

(65) Prior Publication Data

US 2011/0296281 A1    Dec. 1, 2011

(51) Int. Cl.
    *H03M 13/00* (2006.01)
(52) U.S. Cl.
    USPC .......................................................... 714/781
(58) Field of Classification Search
    USPC .............. 714/781, 782, 784, 785, 799, 3, 758
    See application file for complete search history.

(56) References Cited

U.S. PATENT DOCUMENTS

| | | | |
|---|---|---|---|
| 5,444,719 A | 8/1995 | Cox et al. | |
| 6,263,471 B1 * | 7/2001 | Huang | 714/784 |
| 7,701,254 B2 * | 4/2010 | Chow et al. | 326/93 |
| 7,870,468 B1 * | 1/2011 | Vanka et al. | 714/784 |
| 2003/0088757 A1 * | 5/2003 | Lindner et al. | 712/37 |
| 2010/0042907 A1 * | 2/2010 | Pilsl | 714/782 |

OTHER PUBLICATIONS

A literature of G. Fettweis and M. Hassner, "A combined Reed-Solomon Encoder and Syndrome Generator with Small Hardware Complexity," vol. 4, pp. 1871-1874, May, 1992.

* cited by examiner

Primary Examiner — Phung M Chung
(74) Attorney, Agent, or Firm — CKC & Partners Co., Ltd.

(57) ABSTRACT

An apparatus of processing polynomials includes at least one reconfigurable module and an encoder controller. The reconfigurable module includes a plurality of linear feedback shift registers. The encoder controller can control the reconfigurable module to factor a generator polynomial into a factorial polynomial. In the reconfigurable module, the linear feedback shift registers can register a plurality of factors of the factorial polynomial respectively.

16 Claims, 9 Drawing Sheets

APPARATUS AND METHOD OF PROCESSING POLYNOMIALS

BACKGROUND

1. Technical Field

The present disclosure relates to electronic technology, and more particularly, an apparatus and method of processing cyclic codes.

2. Description of Related Art

An error-correcting code (ECC) or forward error correction (FEC) code is a system of adding redundant data, or parity data, to a message, such that it can be recovered by a receiver even when a number of errors (up to the capability of the code being used) were introduced, either during the process of transmission, or on storage. Since the receiver does not have to ask the sender for retransmission of the data, a back-channel is not required in forward error correction, and it is therefore suitable for simplex communication such as broadcasting. Error-correcting codes are frequently used in lower-layer communication, as well as for reliable storage in media such as CDs, DVDs, and dynamic RAM.

Error-correcting codes are usually distinguished between convolutional codes and block codes:

Convolutional codes are processed on a bit-by-bit basis. They are particularly suitable for implementation in hardware, and the Viterbi decoder allows optimal decoding.

Block codes are processed on a block-by-block basis. Early examples of block codes are repetition codes, Hamming codes and multidimensional parity-check codes. They were followed by a number of efficient codes, of which Reed-Solomon codes and BCH codes are the most notable ones due to their widespread use these days. Turbo codes and low-density parity-check codes (LDPC) are relatively new constructions that can provide almost optimal efficiency.

All in all, any error-correcting code can be used for error detection. A code with minimum Hamming distance d can detect up to d−1 errors in a code word. Using error-correcting codes for error correction can be favorable if strict integrity guarantees are desired, and the capacity of the transmission channel can be modeled.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

According to one or more embodiments of the present invention, an apparatus of processing cyclic codes is disclosed, where the cyclic codes may be Reed-Solomon codes, BCH codes or the like. The apparatus includes at least one reconfigurable module and an encoder controller. The reconfigurable module includes a plurality of linear feedback shift registers. The encoder controller can control the reconfigurable module to factor a generator polynomial into a factorial polynomial. In the reconfigurable module, the linear feedback shift registers can register a plurality of factors of the factorial polynomial respectively.

In one embodiment, the encoder controller may essentially consist of a plurality of adders associated with the linear feedback shift registers. The adders and the reconfigurable module constitute a single mode encoder.

In an alternative embodiment, the encoder controller may essentially consist of a plurality of adders and a multiplexer. The adders are associated with the linear feedback shift registers. The multiplexer is configured to select any one of the linear feedback shift registers to control varied modes of an encoding process depending on the desired application. The adders, the multiplexer and the reconfigurable module constitute a multi-mode encoder.

The apparatus may further include a plurality of basis transformers. The basis transformers are electrically coupled with the linear feedback shift registers respectively. In use, the basis transformers can assist the linear feedback shift registers in using the factors of the factorial polynomial to calculate syndromes.

The apparatus may further include a key equation solver. In use, the key equation solver can generate an error location polynomial based on the syndromes.

The apparatus may further include a plurality of inverse basis transformers. The inverse basis transformers are electrically coupled with the linear feedback shift registers respectively. In use, the inverse basis transformers can assist the reconfigurable module and the basis transformers in executing a Chien search for searching all roots of the error location polynomial according to the factors, so as to find an error location.

Moreover, the apparatus may comprise a plurality of foresaid reconfigurable modules in parallelism for supporting varied encoding/decoding speed.

According to one or more embodiments of the present invention, a method of processing cyclic codes in a computer system is disclosed, where the computer system may be a storage element, a communications system or the like. The method includes steps as follows (The steps are not recited in the sequence in which the steps are performed. That is, unless the sequence of the steps is expressly indicated, the sequence of the steps is interchangeable, and all or part of the steps may be simultaneously, partially simultaneously, or sequentially performed). In the encoding process, (a) at least one reconfigurable module is provided, which includes a plurality of linear feedback shift registers; (b) The reconfigurable module is controlled to factor a generator polynomial into a factorial polynomial, so as to register a plurality of factors of the factorial polynomial in the linear feedback shift registers, respectively.

In one embodiment, two or more foresaid reconfigurable modules in parallelism are provided in the step (a) for supporting varied encoding/decoding speed.

In one embodiment, a single mode of the encoding process is performed in the step (b) by means of using the reconfigurable module; in an alternative embodiment, any one of the linear feedback shift registers can be selected in the step (b) to control varied modes of the encoding process depending on the desired application.

The method further includes a decoding process. In the decoding process, (c) syndromes based on the factors of the factorial polynomial are calculated; (d) an error location polynomial based on the syndrome is generated; (e) all roots of the error location polynomial are searched by using the factors, so as to find an error location.

In one embodiment, a plurality of basis transformers, electrically coupled with the linear feedback shift registers respectively, are utilized in the step (c) to for using the factors of the factorial polynomial to calculate syndromes.

In one embodiment, a plurality of inverse basis transformers electrically coupled with the linear feedback shift registers respectively, the reconfigurable module and the basis transformers are utilized in the step (e) to execute a Chien search for searching said all roots of the error location polynomial is according to the factors, so as to find the error location.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
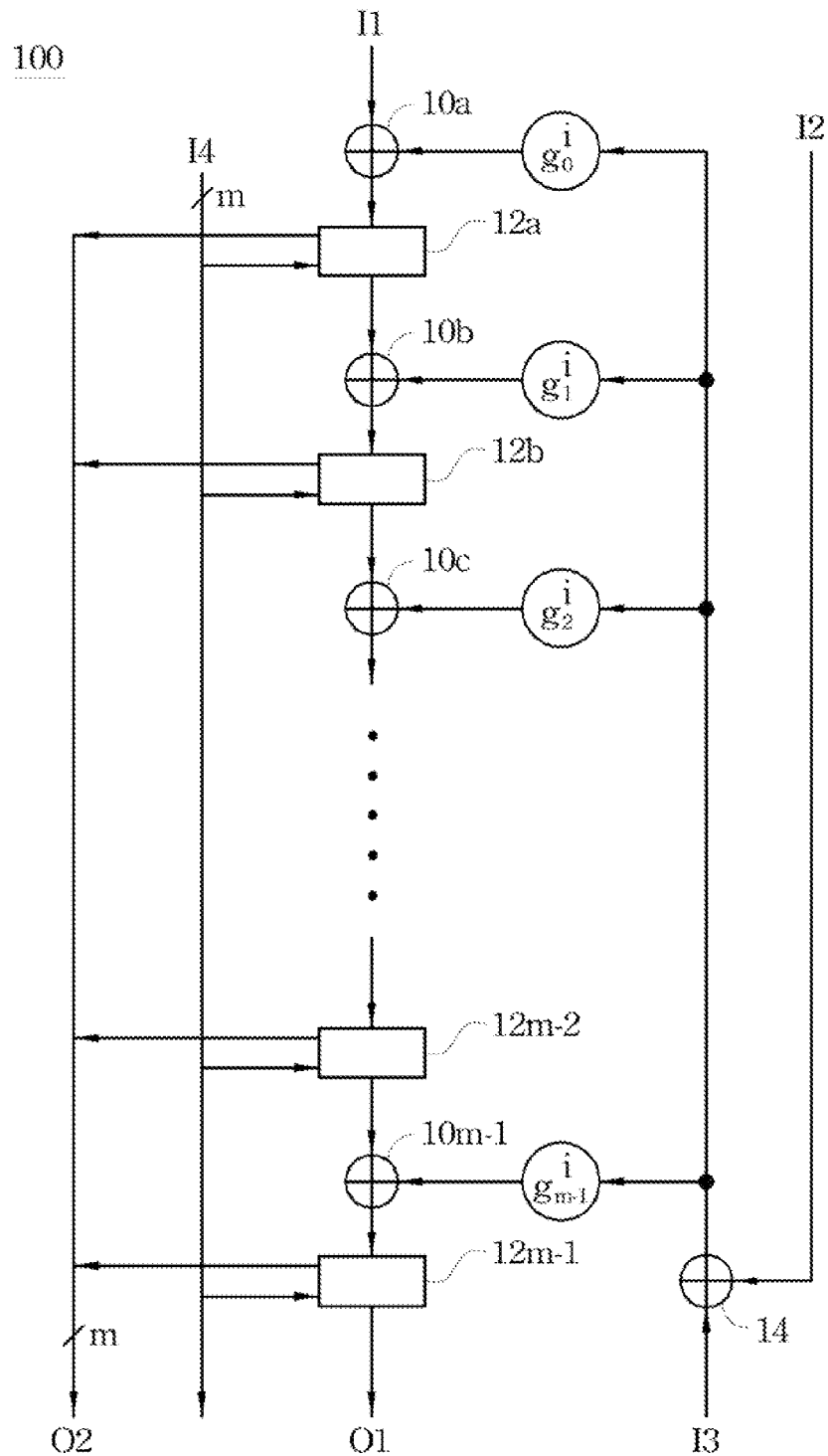
FIG. 1 is a schematic diagram illustrating a linear feedback shift register according to one embodiment of the present invention.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle, will be deployed and the specific concerns (e.g., speed, flexibility, or predictability) of the implementer, any of which may vary.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be, interpreted as having a meaning that is consistent with their meaning in the context of the relevant art and will not be interpreted in an idealized or overly formal sense unless expressly so defined herein.

As shown in FIG. 1, the linear feedback shift register 100 comprises a plurality of fixed multipliers $g_0^i, g_1^i, g_2^i \ldots g_{m-1}^i$, latches 12a, 12b, 12c . . . 12m-2, 12m-1, and adders 10a, 102b, 10c . . . 12m-1 and 14, where $g_j^i$ represents the $j^{th}$ coefficient of the $i^{th}$ minimal polynomial $M_i(x)$. For input, the nodes I1, I2, I3, each receive 1-bit data, and the node I4 receives m-bit. For output, the node O1 outputs 1-bit data, and the node O2 outputs m-bit data.

Figure 2:
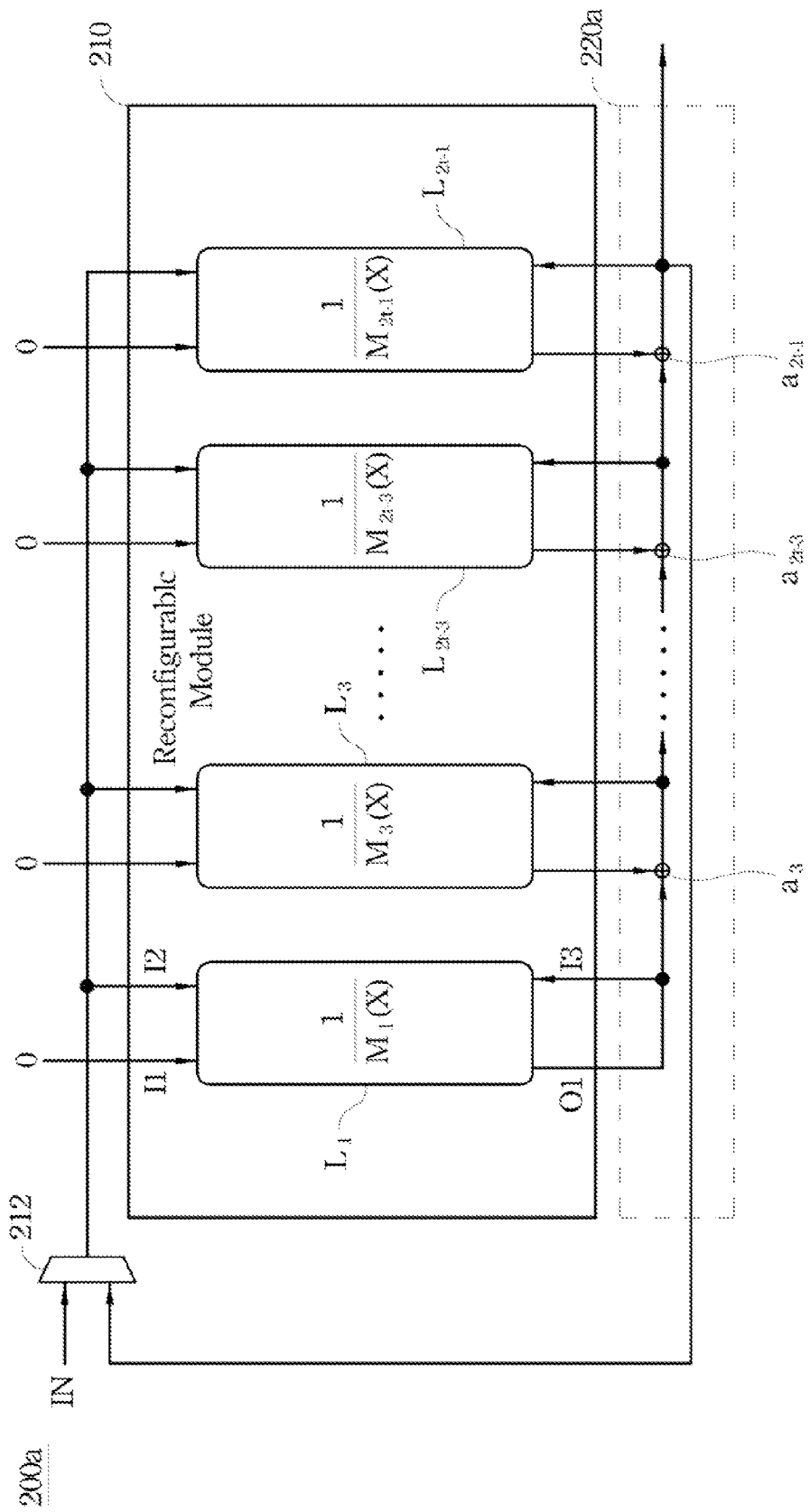
FIG. 2 is a schematic diagram illustrating a single mode encoder according to one embodiment of the present invention.

As shown in FIG. 2, the single mode encoder 200a comprises at least one reconfigurable module 210 and an encoder controller 220a. The reconfigurable module 210 includes a plurality of linear feedback shift registers L1, L3 . . . L2t−3 and L2t−1, where each of these linear feedback shift registers in structure is substantially the same as the above linear feedback shift register 100.

In the single mode encoder 200a, data is inputted through the multiplier 212. The encoder controller 220a can control the reconfigurable module 210 to factor a generator polynomial into the factorial polynomial $M_i(x)$. In the reconfigurable module 210, the linear feedback shift registers L1, L3 . . . L2t−3 and L2t−1 can register a plurality of factors $$\frac{1}{M_1(x)}, \frac{1}{M_3(x)} \cdots \frac{1}{M_{2t-3}(x)}, \frac{1}{M_{st-1}(x)}$$

of the factorial polynomial respectively.

For example, The single mode encoder 200a for encoding BCH codes satisfies the relationship of: $c(x)=x^{n-k}M(x)+r(x)$, where c(x) respects codeword, m(x) respects transmitted information, and $r(x)=x^{n-k}M(x) \mod g(x)$. g(x) is a generator polynomial that satisfies the relationship of: g(x)=LCM {$M_1(x), M_3(x), \ldots, M_{2t-3}(x), M_{2t-1}(x)$}, where $M_i(x)$ is a minimal polynomial and its root is $\alpha^i$.

In FIG. 2, the encoder controller 220a includes a plurality of adders $a_1 \ldots a_{2t-3}, a_{2t-1}$. These adders are associated with the linear feedback shift registers L1, L3 ... L2t−3 and L2t−1. In use, the adders and the reconfigurable module 210 perform a single mode of the encoding process.

Figure 3:
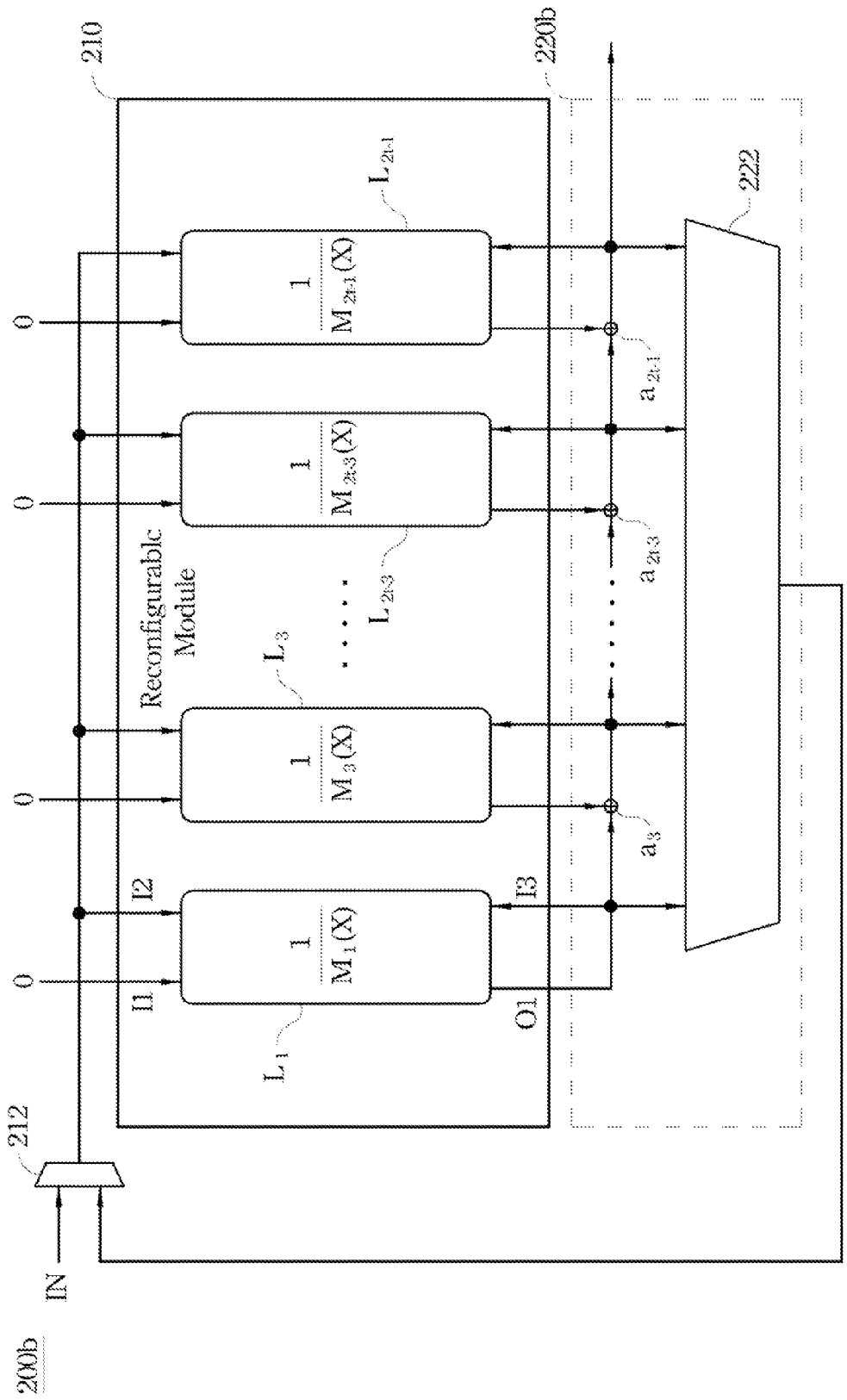
FIG. 3 is a schematic diagram illustrating a multi-mode encoder according to one embodiment of the present invention.

As shown in FIG. 3, the multi-mode encoder 200b is essentially the same as the single mode encoder 200a, expect that an additional multiplexer 222 associated with the linear feedback shift registers L1, L3 ... L2t−3 and L2t−1 is added. The multiplexer 222 can select one of the nodes 13 of the reconfigurable module 210 services as a feedback signal to control varied modes of the encoding process depending on the desired application.

Figure 4:
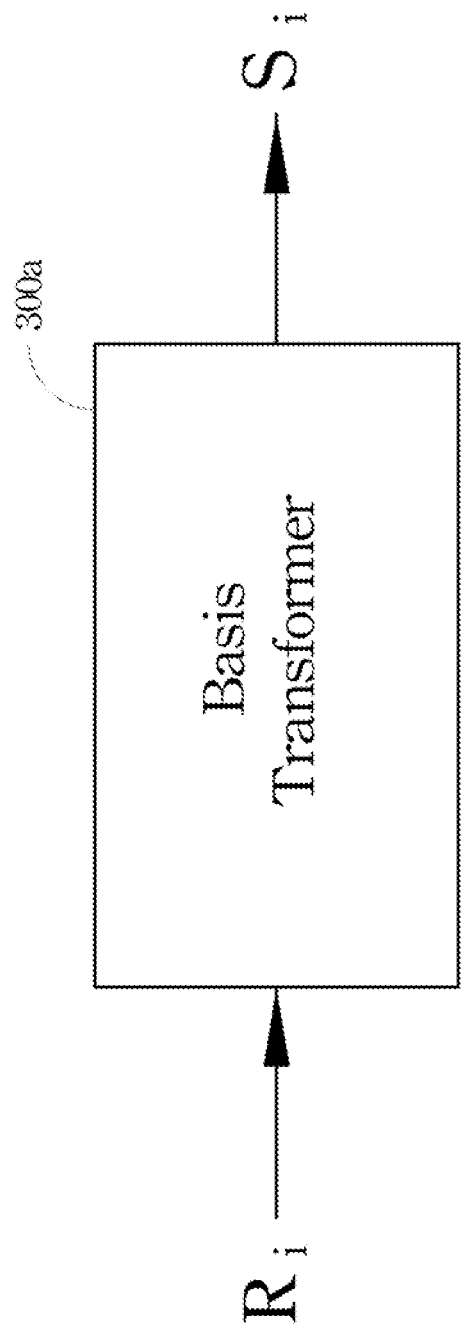
FIG. 4 is a block diagram illustrating a basis transformer according to one embodiment of the present invention.

It should be appreciated that single one reconfigurable module 210 illustrated in FIGS. 3-4 is only examples and should not be regarded as limitations of the present invention. In another embodiment, a plurality of said reconfigurable modules are provided in parallelism for supporting varied encoding/decoding speed.

As shown in FIG. 4, the basis transformer 300a transform input data into output data. In use, the basis transformer 300a can receive m-bit data $R_i$ and then can output m-bit data $S_0$.

Figure 5:
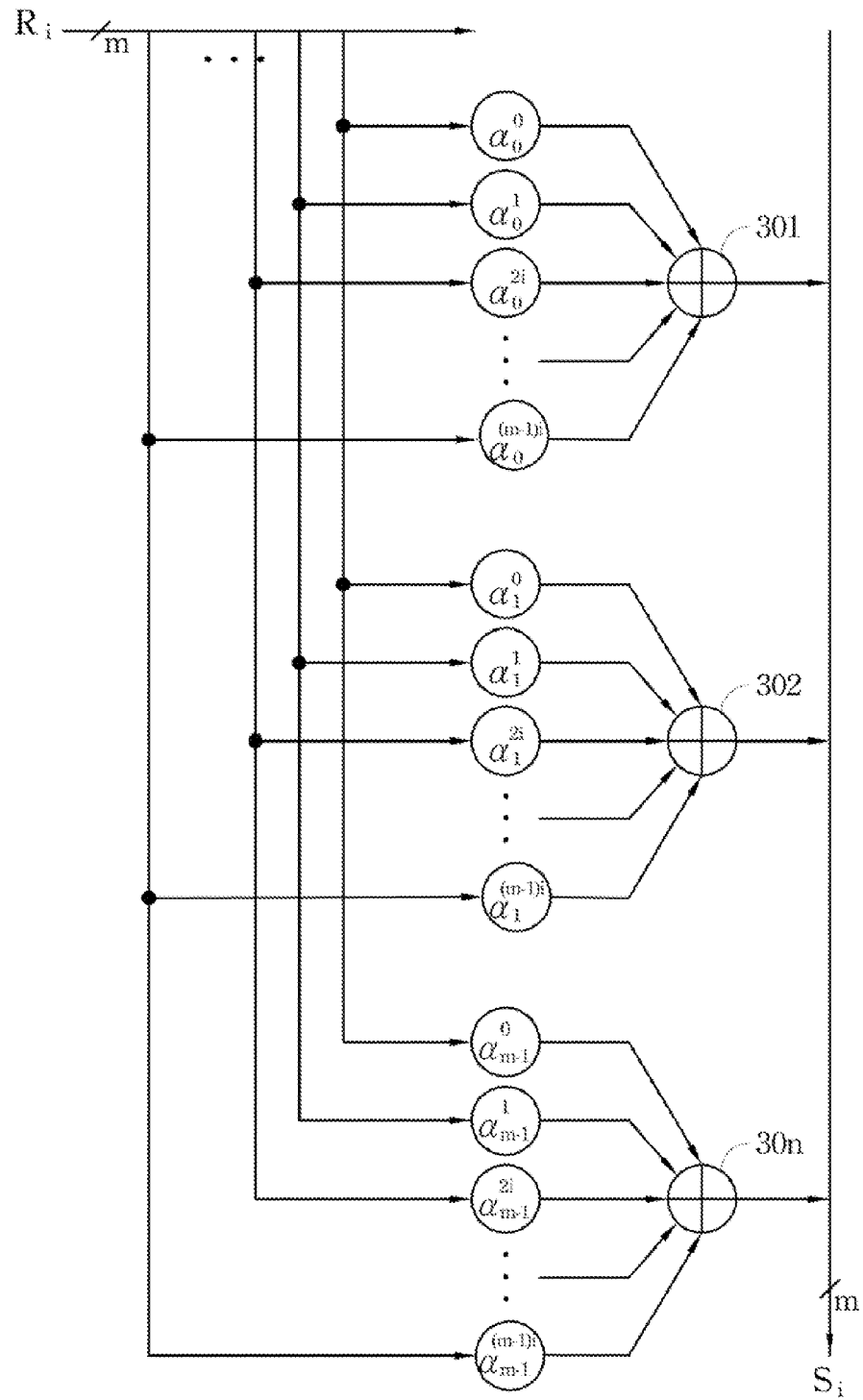
FIG. 5 depicts the basis transformer of FIG. 4.

For a more complete understanding of the basis transformer 300a, please refer to FIG. 5. FIG. 5 depicts the $i^{th}$ basis transformer for generating data $S_i$, where a $\alpha_j^i$ represents the $j^{th}$ coefficient of $\alpha^i$, in which $\alpha$ is the primitive element of GF($2^m$). In this basis transformer, a plurality of fixed multipliers a $\alpha_0^0, \alpha_0^1 \ldots \alpha_0^{2i}, \alpha_0^{(m-1)1}$ are associated with the adder 301; a plurality of fixed multipliers $\alpha_1^0, \alpha_1^1 \ldots \alpha_1^{2i}, \alpha_1^{(m-1)1}$ are associated with the adder 302; a plurality of fixed multipliers $\alpha_{m-1}^0, \alpha_{m-1}^1 \ldots \alpha_{m-1}^{2i}, \alpha_{m-1}^{(m-1)1}$ are associated with the adder 30n.

Figure 6:
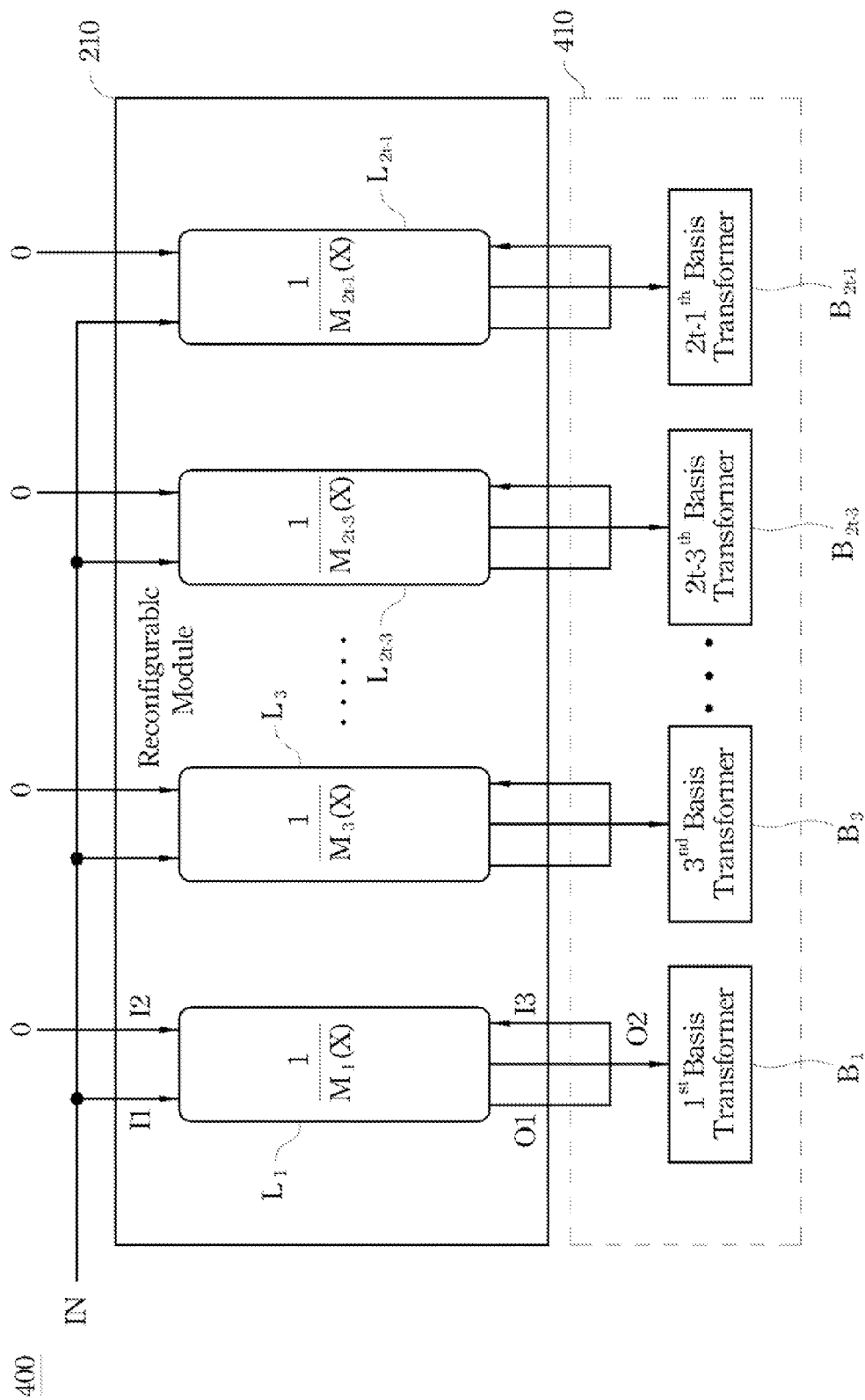
FIG. 6 is a schematic diagram illustrating a syndrome calculator according to one embodiment of the present invention.

As shown in FIG. 6, the syndrome calculator 400 includes a plurality of basis transformers 410 and the foresaid the reconfigurable module 210, where each of these basis transformers $B_1, B_3 \ldots a_{2t-3}, a_{2t-1}$ is substantially the same as the above basis transformer 300a. The basis transformers $B_1, B_3 \ldots a_{2t-3}, a_{2t-1}$ are electrically coupled with the linear feedback shift registers L1, L3 ... L2t−3 and L2t−1 respectively for using the factors of the factorial polynomial to calculate syndromes. Moreover, the key equation solver (not shown) can be configured to generate an error location polynomial based on the syndromes.

Figure 7:
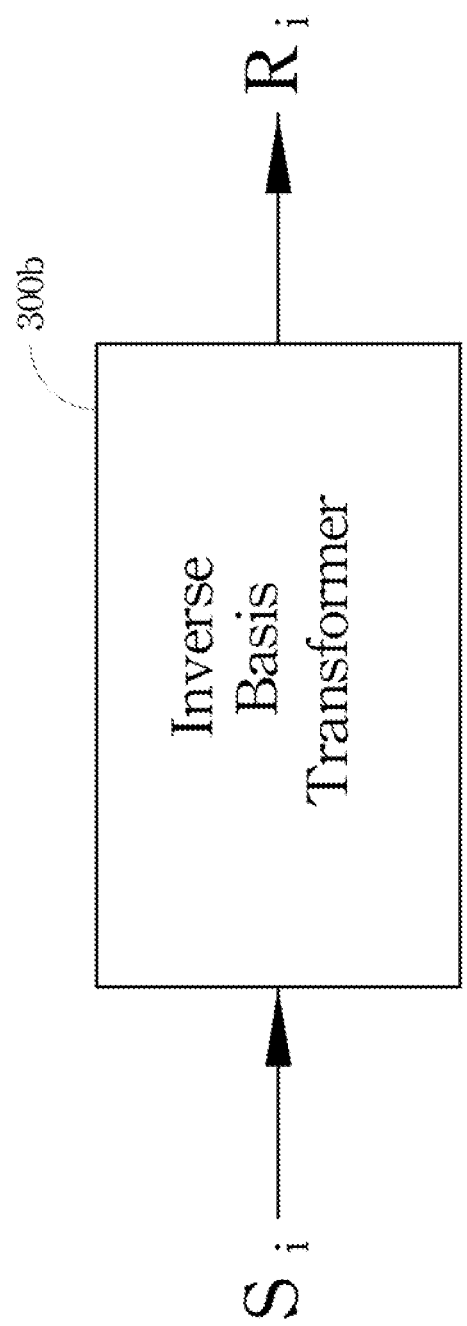
FIG. 7 is a block diagram illustrating an inverse basis transformer according to one embodiment of the present invention.

As shown in FIG. 7, the inverse basis transformer 300b performs matrix operation to the basis transformer 300a. In use, the inverse basis transformer 300b can receive m-bit data $S_i$ and then can output m-bit data $R_i$.

Figure 8:
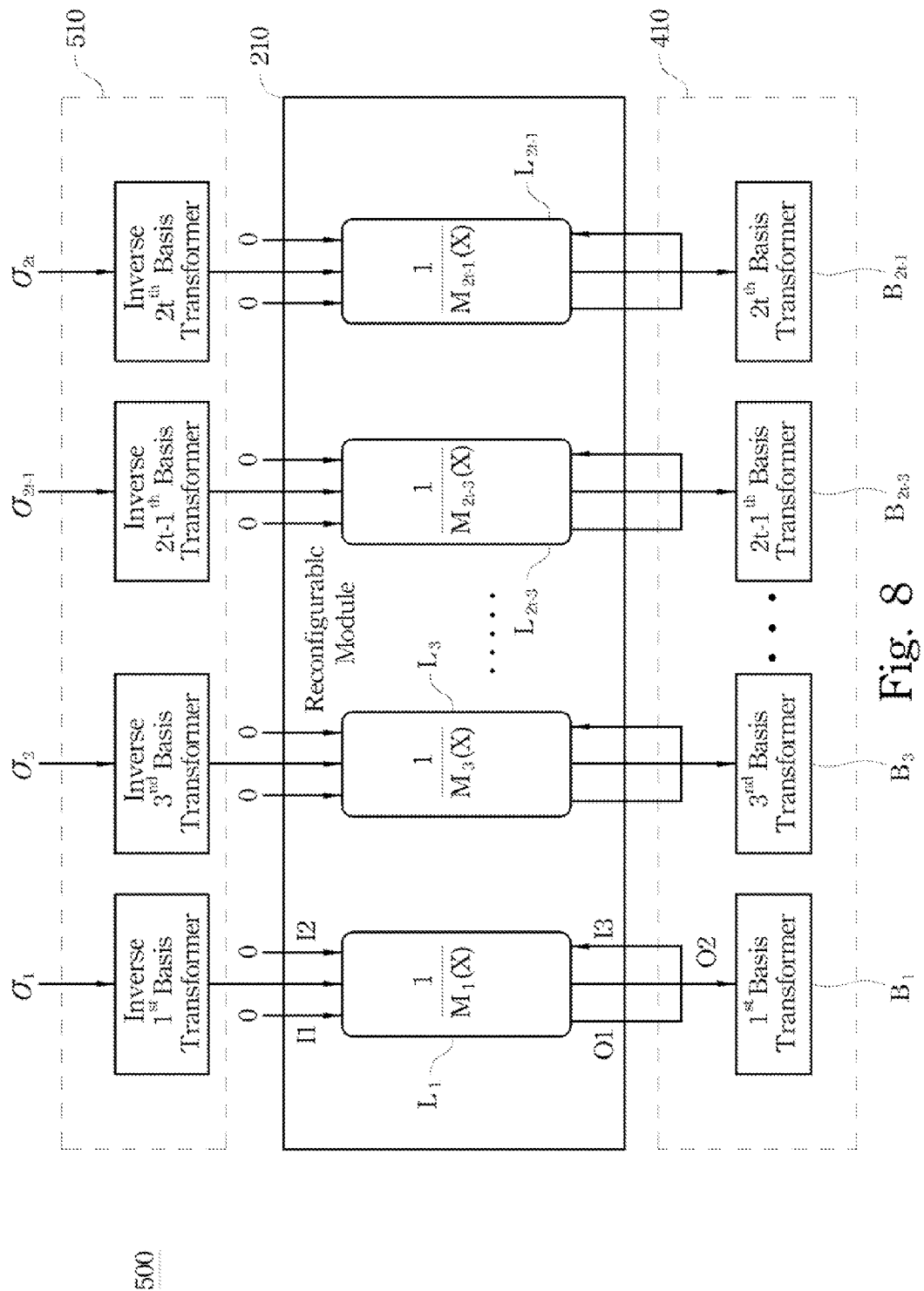
FIG. 8 is a schematic diagram illustrating a Chien search unit according to one embodiment of the present invention.

As shown in FIG. 8, the Chien search unit 500 includes a plurality of inverse basis transformers 510, the reconfigurable module 210 and the basis transformers 410, where each of these basis transformers is substantially the same as the above inverse basis transformer 300b. The inverse basis transformers are electrically coupled with the linear feedback shift registers $B_1, B_3 \ldots a_{2t-3}, a_{2t-1}$, respectively. In use, the Chien search unit 500 is configured to execute a Chien search for searching all roots of the error location polynomial according to the factors, so as to find an error location.

In view of above, the encoder and the syndrome calculator 400 can share the same reconfigurable module 120, and furthermore the syndrome calculator 400 and the Chien search unit 500 can share the same reconfigurable module 120 and the same basis transformers 410. It should be noted that the number of logic gates in the present apparatus for processing cyclic codes is reduced, so as to simplify the complexity of encoding/decoding process. In practice, about 27.5% logic gates are reduced in 0.18 um CMOS process.

Figure 9:
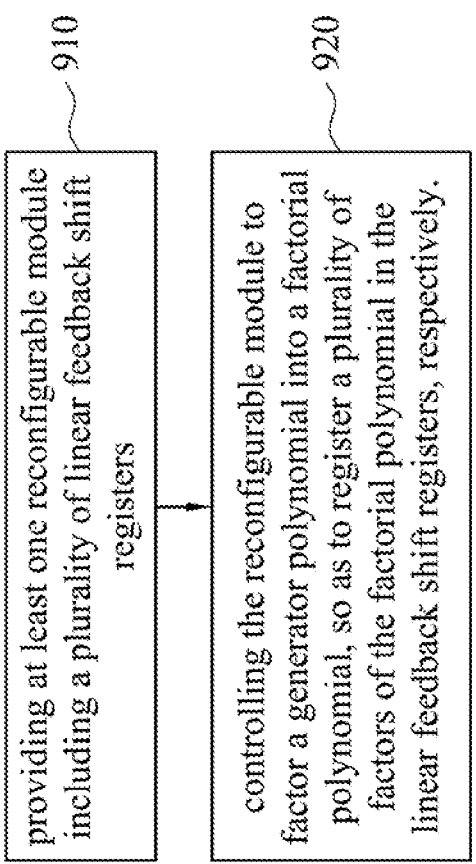
FIG. 9 is a flow diagram illustrating a method of processing polynomials according to one embodiment of the present invention.

In another aspect, the present disclosure is directed to a method of processing polynomials, as shown in FIG. 9. This method may be easily applied to existing computer systems and may be applicable or readily adaptable to various technologies. In FIG. 9, the method includes a step 910 of providing at least one reconfigurable module including a plurality of linear feedback shift registers, and another step 920 of controlling the reconfigurable module to factor a generator polynomial into a factorial polynomial, so as to register a plurality of factors of the factorial polynomial in the linear feedback shift registers, respectively. The more detail of the method is disclosed in the above embodiments and, thus, is not repeated herein.

It will be understood that the above description of embodiments is given by way of example only and that those with ordinary skill in the art may make various modifications. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. An apparatus of processing polynomials, the apparatus comprising:
    at least one reconfigurable module including a plurality of linear feedback shift registers to receive input data respectively; and
    an encoder controller for controlling the reconfigurable module to factor a generator polynomial based on the input data into a factorial polynomial, the linear feedback shift registers for registering a plurality of factors of the factorial polynomial respectively, and the encoder controller having an output fed back to the reconfigurable module.

2. The apparatus of claim 1, wherein the encoder controller essentially consists of a plurality of adders associated with the linear feedback shift registers, wherein the adders and the reconfigurable module constitute a single mode encoder.

3. The apparatus of claim 1, wherein the encoder controller essentially consists of a plurality of adders associated with the linear feedback shift registers and a multiplexer configured to select one of the linear feedback shift registers to control varied modes of an encoding process, wherein the adders, the multiplexer and the reconfigurable module constitute a multi-mode encoder.

4. The apparatus of claim 1, further comprising:
    means for assisting the linear feedback shift registers in using the factors of the factorial polynomial to calculate syndromes;
    a key equation solver for generating an error location polynomial based on the syndromes; and
    means for assisting the reconfigurable module and the means for assisting the linear feedback shift registers in executing a Chien search for searching all roots of the error location polynomial according to the factors, so as to find an error location.

5. An apparatus of processing polynomials, the apparatus comprising:
   at least one reconfigurable module including a plurality of linear feedback shift registers to receive input data respectively; and
   means for controlling the reconfigurable module to factor a generator polynomial based on the input data into a factorial polynomial, the linear feedback shift registers for registering a plurality of factors of the factorial polynomial respectively, and the controlling means having an output fed back to the reconfigurable module.

6. The apparatus of claim 5, wherein the controlling means includes means for using the reconfigurable module to perform a single mode of the encoding process.

7. The apparatus of claim 5, wherein the controlling means includes means for selecting one of the linear feedback shift registers to control varied modes of an encoding process.

8. The apparatus of claim 5, further comprising:
   means for assisting the linear feedback shift registers in using the factors of the factorial polynomial to calculate syndromes;
   a key equation solver for generating an error location polynomial based on the syndromes; and
   means for assisting the reconfigurable module and the means for assisting the linear feedback shift registers in executing a Chien search for searching all roots of the error location polynomial according to the factors, so as to find an error location.

9. A method of processing polynomials in a computer system, the method comprising:
   (a) providing at least one reconfigurable module including a plurality of linear feedback shift registers to receive input data respectively; and
   (b) utilizing an encoder controller for controlling the reconfigurable module to factor a generator polynomial based on the input data into a factorial polynomial, so as to register a plurality of factors of the factorial polynomial in the linear feedback shift registers, respectively, and the encoder controller having an output fed back to the reconfigurable module.

10. The method of claim 9, wherein the step (b) comprises: using the reconfigurable module to perform a single mode of the encoding process.

11. The method of claim 9, wherein the step (b) comprises: selecting one of the linear feedback shift registers to control varied modes of an encoding process.

12. The method of claim 9, further comprising:
   (c) calculating syndromes based on the factors of the factorial polynomial;
   (d) generating an error location polynomial based on the syndromes, and
   (e) using the factors to search all roots of the error location polynomial, so as to find an error location.

13. The method of claim 12, wherein the step (c) comprises:
   utilizing a plurality of basis transformers electrically coupled with the linear feedback shift registers respectively for using the factors of the factorial polynomial to calculate syndromes.

14. The method of claim 13, wherein the step (e) comprises:
   utilizing a plurality of inverse basis transformers electrically coupled with the linear feedback shift registers respectively, the reconfigurable module and the basis transformers to execute a Chien search for searching said all roots of the error location polynomial according to the factors, so as to find the error location.

15. The method of claim 12, wherein the step (e) comprises:
   utilizing a plurality of inverse basis transformers electrically coupled with t the linear feedback shift registers respectively, the reconfigurable module and the basis transformers to execute a Chien search for searching said all roots of the error location polynomial according to the factors, so as to find the error location.

16. The method of claim 9 in which the computer system is a storage element or a communications system.

* * * * *